(12) United States Patent
Guo et al.

(10) Patent No.: US 10,949,031 B2
(45) Date of Patent: Mar. 16, 2021

(54) TOUCH DISPLAY SUBSTRATE AND TOUCH DISPLAY DEVICE

(71) Applicant: BOE TECHNOLOGY GROUP CO., LTD., Beijing (CN)

(72) Inventors: Yuzhen Guo, Beijing (CN); Xue Dong, Beijing (CN); Haisheng Wang, Beijing (CN); Chunwei Wu, Beijing (CN); Yingming Liu, Beijing (CN); Changfeng Li, Beijing (CN); Yanan Jia, Beijing (CN); Lijun Zhao, Beijing (CN); Yunke Qin, Beijing (CN); Pinchao Gu, Beijing (CN); Rui Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 45 days.

(21) Appl. No.: 16/200,711

(22) Filed: Nov. 27, 2018

(65) Prior Publication Data

US 2019/0095046 A1 Mar. 28, 2019

Related U.S. Application Data

(63) Continuation-in-part of application No. PCT/CN2018/075758, filed on Feb. 8, 2018.

(30) Foreign Application Priority Data

Jul. 18, 2017 (CN) .......................... 201710586468.7

(51) Int. Cl.
*G06F 3/043* (2006.01)
*B06B 1/06* (2006.01)
*H01L 41/113* (2006.01)
*G06F 3/041* (2006.01)
(Continued)

(52) U.S. Cl.
CPC .......... *G06F 3/0436* (2013.01); *B06B 1/0622* (2013.01); *B06B 1/0644* (2013.01);
(Continued)

(58) Field of Classification Search
CPC ...... G06F 3/0436; G06F 3/0412; G06F 3/043; H01L 41/047; H01L 41/1132;
(Continued)

(56) References Cited

U.S. PATENT DOCUMENTS

2012/0154110 A1 6/2012 Kim et al.
2013/0201134 A1* 8/2013 Schneider ............... G06F 3/041
345/173

(Continued)

FOREIGN PATENT DOCUMENTS

CN 103257756 A 8/2013
CN 103885636 A 6/2014
(Continued)

OTHER PUBLICATIONS

Office Action issued in corresponding Chinese Application No. 201710586468.7.
(Continued)

*Primary Examiner* — Christopher E Leiby
(74) *Attorney, Agent, or Firm* — Nath, Goldberg & Meyer; Joshua B. Goldberg

(57) ABSTRACT

The disclosure provides a touch display substrate and a touch display device. The touch display substrate includes: a substrate; a plurality of ultrasonic sensors disposed on the substrate; and one ultrasonic generator disposed on the substrate. The ultrasonic generator has a plurality of openings, and at least one of the plurality of ultrasonic sensors is disposed in at least one of the openings.

20 Claims, 4 Drawing Sheets

(51) Int. Cl.
*H01L 41/047* (2006.01)
*G06K 9/00* (2006.01)

(52) U.S. Cl.
CPC ............ *G06F 3/043* (2013.01); *G06F 3/0412* (2013.01); *H01L 41/047* (2013.01); *H01L 41/1132* (2013.01); *G06K 9/0002* (2013.01); *G06K 9/0008* (2013.01)

(58) Field of Classification Search
CPC .. B06B 1/0622; B06B 1/0644; G06K 9/0002; G06K 9/0008
See application file for complete search history.

(56) References Cited

U.S. PATENT DOCUMENTS

| | | | | |
|---|---|---|---|---|
| 2015/0165479 | A1* | 6/2015 | Lasiter | B06B 1/0666 310/322 |
| 2016/0107194 | A1* | 4/2016 | Panchawagh | G06F 3/0436 367/140 |
| 2016/0224147 | A1 | 8/2016 | Ding et al. | |
| 2018/0349665 | A1* | 12/2018 | He | B06B 1/0622 |
| 2019/0095046 | A1 | 3/2019 | Guo et al. | |

FOREIGN PATENT DOCUMENTS

| | | |
|---|---|---|
| CN | 106406641 A | 2/2017 |
| CN | 106896963 A | 6/2017 |
| CN | 107368227 A | 11/2017 |

OTHER PUBLICATIONS

International Search Report dated May 8, 2018 issued in corresponding International Application No. PCT/CN2018/075758.
The Second Office Action dated Jul. 2, 2019 corresponding to Chinese application No. 201710586468.7.

* cited by examiner ically insulated from each other, and the bias electrode and the lower electrode are disposed substantially in a same layer and are electrically insulated from each other.

TOUCH DISPLAY SUBSTRATE AND TOUCH DISPLAY DEVICE

CROSS-REFERENCE TO RELATED APPLICATIONS

This is a Bypass Continuation of PCT/CN2018/075758, filed on Feb. 8, 2018, an application claiming the benefit of priority to Chinese Patent Application No. 201710586468.7 filed on Jul. 18, 2017, the contents of which are incorporated herein in their entirety by reference.

TECHNICAL FIELD

The present disclosure relates to the field of touch display technologies, and in particular, to a touch display substrate and a touch display device.

BACKGROUND

When divided by type, touch screens mainly includes a resistive touch screen, an ultrasonic touch screen, an infrared touch screen, and a capacitive touch screen. The principle for the ultrasonic touch screen is to sense a touched position, using an ultrasonic wave propagating on a surface of a medium, when the energy and shape of the ultrasonic wave are changed due to contact of an object.

The ultrasonic sensing structure in existing ultrasonic touch screens mainly includes two major parts, that is, an ultrasonic generator and an ultrasonic receiving device. The ultrasonic generator generally includes an upper electrode and a lower electrode, and a piezoelectric material layer disposed between the upper electrode and the lower electrode. When a voltage signal of a certain frequency is applied across the upper and lower electrodes, the intermediate piezoelectric material layer undergoes a regular deformation in accordance with the frequency of the electrical signal, thereby causing the air to vibrate to generate sound waves. When the frequency reaches a certain level, ultrasonic waves are generated. The ultrasonic receiving device generally includes an upper electrode and a lower electrode, and a piezoelectric material layer disposed between the upper electrode and the lower electrode. When air vibration due to the sound waves causes the piezoelectric material layer of the ultrasonic receiving device to undergo a corresponding regular deformation, the upper electrode and the lower electrode of the ultrasonic receiving device can sense a regular electrical signal.

SUMMARY

Sensors

According to an aspect of the present disclosure, a touch display substrate is provided, which includes: a substrate, a plurality of ultrasonic sensors disposed on the substrate, and one ultrasonic generator disposed on the substrate, wherein at least one of the ultrasonic generator has a plurality of openings, and the plurality of ultrasonic sensors is disposed in at least one of the plurality of openings.

According to an embodiment of the present disclosure, the ultrasonic generator and the ultrasonic sensors may be disposed substantially in a same layer.

According to an embodiment of the disclosure, the touch display substrate may include a plurality of pixels arranged in an array and a peripheral area surrounding the plurality of pixels, and each of the plurality of openings corresponds to each of the plurality of openings.

According to an embodiment of the present disclosure, each of the ultrasonic sensors may include a data electrode, a bias electrode, and a sensing piezoelectric layer disposed between the data electrode and the bias electrode, and the ultrasonic generator may include an upper electrode, a lower electrode, and a generating piezoelectric layer disposed between the upper electrode and the lower electrode.

According to an embodiment of the present disclosure, the data electrode and the lower electrode are disposed substantially in a same layer and are electrically insulated from each other, and the bias electrode and the upper electrode are disposed substantially in a same layer and are electrically insulated from each other. Alternatively, the data electrode and the upper electrode are disposed substantially in a same layer and are electrically insulated from each other, and the bias electrode and the lower electrode are disposed substantially in a same layer and are electrically insulated from each other.

According to an embodiment of the disclosure, the sensing piezoelectric layer and the generating piezoelectric layer may be disposed substantially in a same layer.

According to an embodiment of the present disclosure, each of the plurality of pixels may include a plurality of sub-pixels, the ultrasonic sensor and the sub-pixels are arranged in an array, and the ultrasonic generator has a grid-shaped distribution.

According to an embodiment of the present disclosure, each of the plurality of pixels may include a plurality of sub-pixels, and a black matrix is disposed around the sub-pixels, wherein an orthographic projection area of each of the ultrasonic sensors on the substrate is less than or equal to an orthographic projection area of a grid line of the black matrix on the substrate, and an orthographic projection area of the ultrasonic generator on the substrate is less than or equal to an orthographic projection area of the plurality of pixels on the substrate.

According to an embodiment of the present disclosure, each of the sub-pixels and each of the ultrasonic sensors may be respectively disposed on two opposite surfaces of the substrate.

According to an embodiment of the present disclosure, the touch display substrate may further include a glass substrate provided with a TFT, wherein the sub-pixels and the black matrix are disposed on one side of the glass substrate, and the ultrasonic generator and the ultrasonic sensors are disposed on the other surface of the glass substrate.

According to another aspect of the present disclosure, a touch display device is further provided, which includes a touch display substrate according to the present disclosure.

DETAILED DESCRIPTION

For better understanding of the technical solutions of the present disclosure by those skilled in the art, the present disclosure will be further described in detail below in conjunction with the accompanying drawings and specific embodiments.

Figure 1:
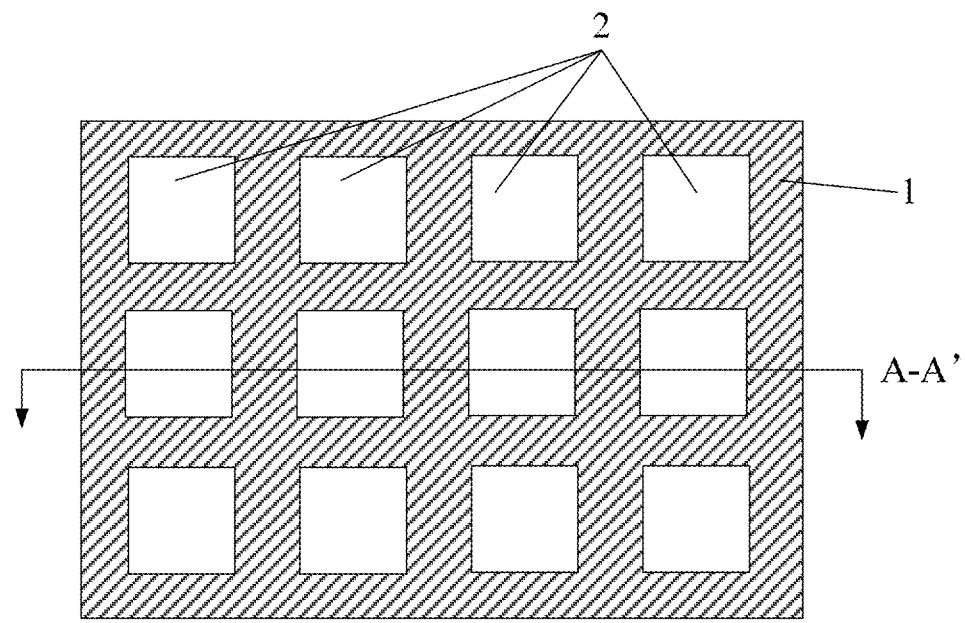
FIG. 1 is a schematic plan view illustrating a touch display substrate according to an embodiment of the present disclosure.
Figure 2:
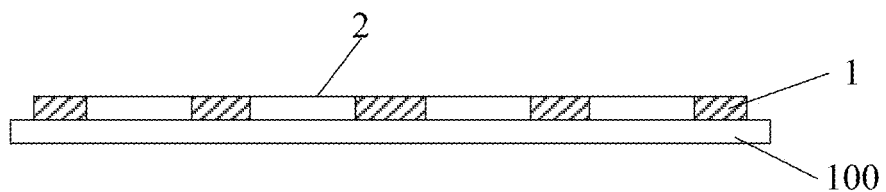
FIG. 2 is a cross-sectional view taken along line A-A' of FIG. 1.

FIG. 1 is a schematic plan view illustrating a touch display substrate according to an embodiment of the present disclosure, and FIG. 2 is a cross-sectional view taken along line A-A' of FIG. 1.

As illustrated in FIGS. 1 and 2, a touch display substrate according to an embodiment of the present disclosure may include a substrate 100, a plurality of ultrasonic sensors 2 disposed on the substrate 100, and one ultrasonic generator 1 disposed on the substrate 100. The ultrasonic generator 1 may have a plurality of openings, and at least one of the plurality of ultrasonic sensors 2 is disposed in at least one of the plurality of openings.

Referring to FIGS. 1 and 2, in this embodiment, the ultrasonic generator 1 and the ultrasonic sensors 2 are disposed substantially in a same layer, and the ultrasonic generator 1 is disposed around the edge of each ultrasonic sensor 2. Therefore, the thickness of the touch display substrate can be reduced as compared to the related art. The ultrasonic generator 1 having the plurality of openings is used to generate ultrasonic waves, and respective ultrasonic sensors 2 are evenly arranged in respective openings to receive the ultrasonic signals. According to the embodiment of the disclosure, when the touch display substrate is touched, the ultrasonic wave generated by the ultrasonic generator 1 can reach a contact interface between a finger and the touch display substrate. The ridge of the fingerprint texture (i.e., the fingerprint ridge) comes into contact with the touch display substrate, and there is no gap between the fingerprint ridge and the touch display substrate. In this case, the fingerprint ridge will absorb the ultrasonic energy emitted thereto. Further, at the position of the valley of the fingerprint texture (i.e., the fingerprint valley), there is a gap between the finger and the touch display substrate. In this case, the ultrasonic energy will be reflected at the interface of the air and the touch display substrate, such that the reflected ultrasonic waves will be detected by the ultrasonic sensors 2. After data processing, a fingerprint pattern can be created based on the above two different signals.

Figure 3:
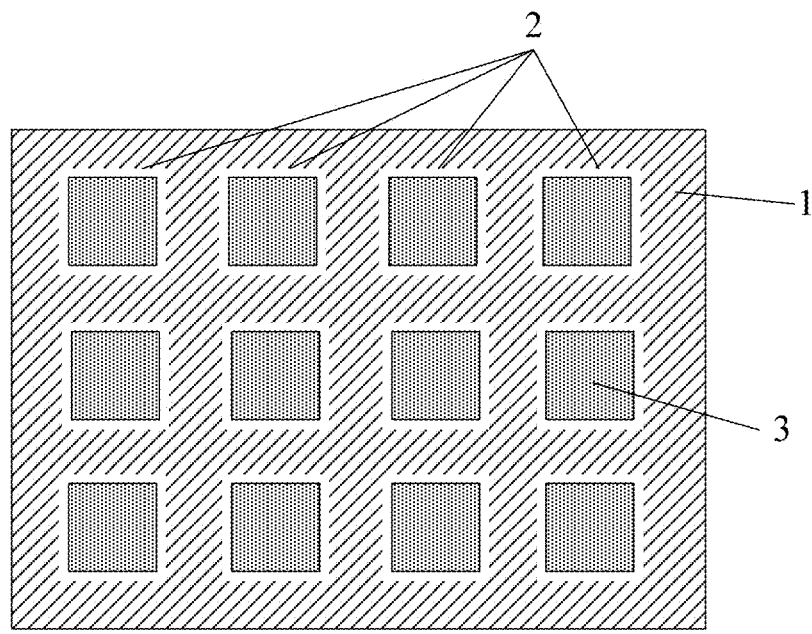
FIGS. 3 to 5 are schematic diagrams illustrating a structure of a touch display substrate according to another embodiment of the present disclosure.
Figure 4:
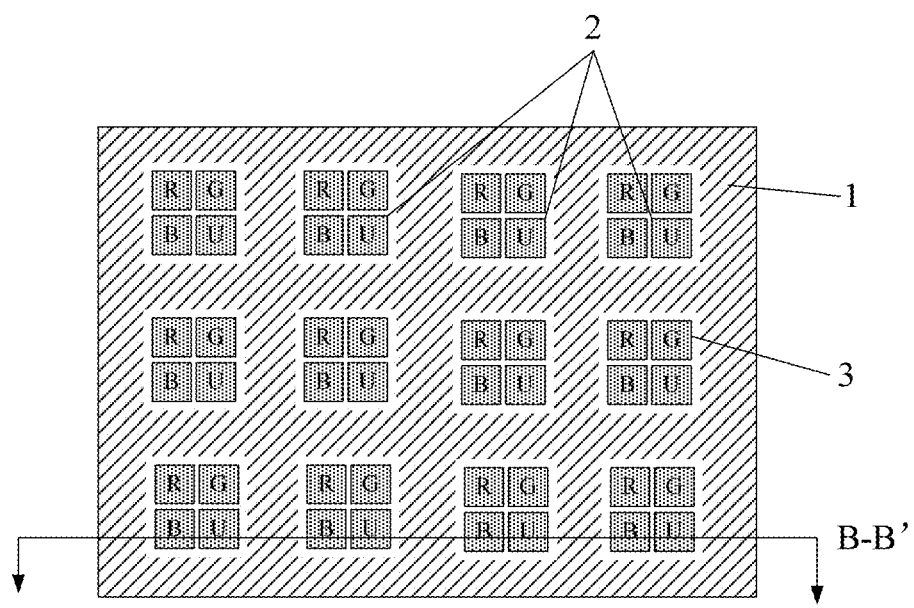
Figure 5:
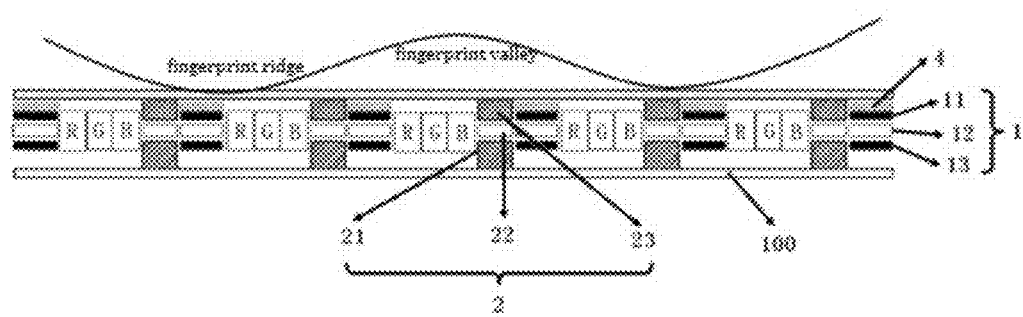

FIGS. 3 to 5 are schematic diagrams illustrating a structure of a touch display substrate according to another embodiment of the present disclosure.

As illustrated in FIGS. 3 to 5, the touch display substrate according to another embodiment of the present disclosure may include a substrate 100, a plurality of ultrasonic sensors 2 disposed on the substrate 100, and one ultrasonic generator 1 disposed on the substrate 100. The ultrasonic generator 1 and the ultrasonic sensors 2 are disposed substantially in a same layer, and the ultrasonic generator 1 has a plurality of openings, wherein at least one of the plurality of ultrasonic sensors 2 is disposed in at least one of the plurality of openings. The touch display substrate may further include a plurality of pixels 3 arranged in an array and a peripheral area surrounding the plurality of pixels 3, and each of the plurality of openings corresponds to each of the plurality of openings 3.

Both of the plurality of ultrasonic sensors 2 and the plurality of pixels 3 in FIG. 3 are arranged in an array, such that each structural layer of each ultrasonic sensor 2 can be formed by using the same mask as that used for forming each pixel 3.

According to an embodiment of the present disclosure, as illustrated in FIG. 4, each of the pixels 3 may include a plurality of sub-pixels, the ultrasonic sensor 2 and the sub-pixels are arranged in an array, and the ultrasonic generator 1 has a grid-shaped distribution.

In the embodiment illustrated in FIG. 4, each pixel 3 is illustrated to include sub-pixels such as a red (R) sub-pixel, a green (G) sub-pixel, and a blue (B) sub-pixel, wherein the reference sign "U" in FIG. 4 represents the ultrasonic sensor 2. The ultrasonic sensor 2 may function as a sub-pixel without display function and used to receive an ultrasonic signal. It should be noted that, in this embodiment, the ultrasonic sensor 2 (U) and the respective sub-pixels (R, G, B) are arranged in an array form, that is, an ultrasonic sensor 2 is disposed in each of the pixels 3, in order to make touch sensing more sensitive. It can be understood that though the red, green, and blue sub-pixels are exemplified in FIG. 4, the inventive concept of this disclosure is not limited thereto. The sub-pixels may include a cyan sub-pixel, a violet sub-pixel, a yellow sub-pixel, and so on. Further, though respective sub-pixels and the ultrasonic sensors 2 in each pixel 3 are arranged in a 2×2 array in FIG. 4, the inventive concept of this disclosure is not limited thereto. It is also possible to arrange respective sub-pixels and the ultrasonic sensors 2 in each pixel 3 in a row (see FIG. 5), the details for that will not be described herein.

FIG. 5 is a cross-sectional view taken along line B-B' of FIG. 4. Referring to FIG. 5, the ultrasonic sensor 2 may include a data electrode 21, a bias electrode 23, and a sensing piezoelectric layer 22 disposed between the data electrode 21 and the bias electrode 23, in accordance with an embodiment of the present disclosure. The ultrasonic generator 1 may include an upper electrode 11, a lower electrode 13, and a generating piezoelectric layer 12 disposed between the upper electrode 11 and the lower electrode 13.

The substrate 100 may be a substrate of an array substrate. A driving circuit (not illustrated) for the ultrasonic sensors 2 may further be disposed on the substrate 100. A via hole may be formed under a position of each sensor 2 and the data electrode 21 may be formed in the form of a pixel electrode. The data electrode 21 may be connected to a pixel circuit on the substrate 100. The bias electrode 23 may be a common electrode of the display panel, but the inventive concept of this disclosure is not limited thereto. The bias electrode 23 may also be formed independently of the common electrode of the display panel. According to an embodiment of the present disclosure, the sensing piezoelectric layer 22 may be composed of an inorganic material such as lead zirconate titanate, barium titanate or ZnO, or may be composed of an organic piezoelectric material such as polyvinylidene fluoride. The ultrasonic generator 1 may be a whole-surface structure in a grid-shaped distribution.

Figure 6:
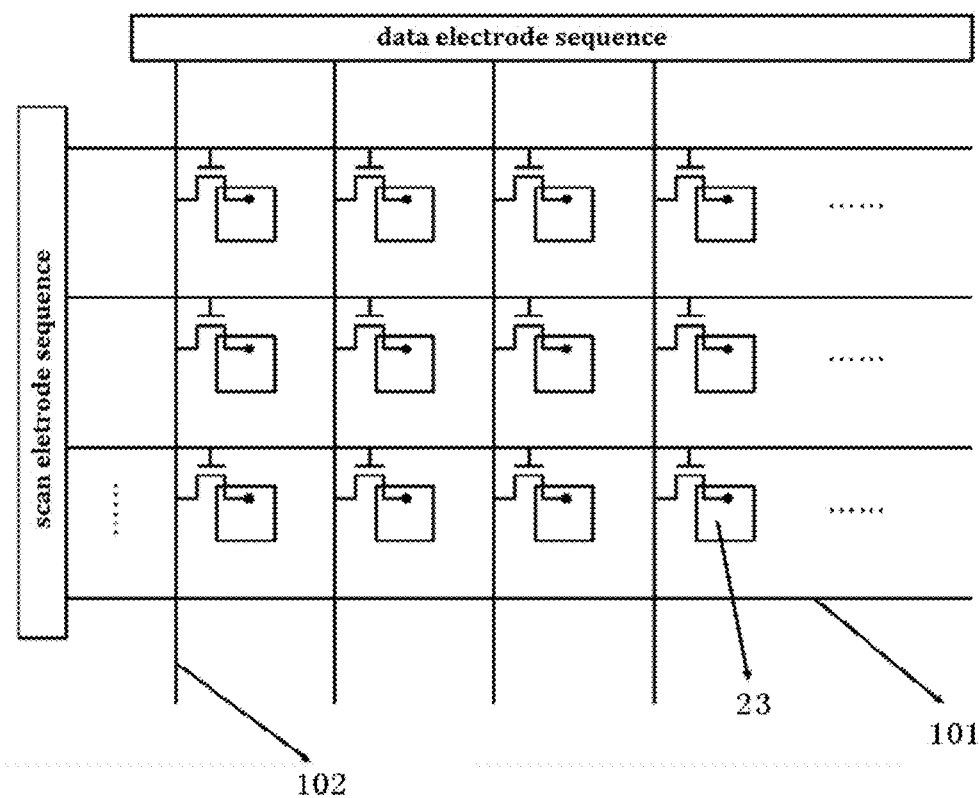
FIG. 6 is a schematic diagram illustrating a driving principle of a touch display substrate according to an embodiment of the present disclosure.

FIG. 6 is a schematic diagram illustrating a driving principle of a touch display substrate according to an embodiment of the present disclosure.

Referring to FIG. 6, gate lines/scan lines 101 and data lines 102 are disposed to cross each other, and each gate line 101 and each data line 102 are connected to the gate electrode and source/drain electrode of a thin film transistor (TFT), respectively. When receiving the ultrasonic signal, scanning signals are input to the gate electrodes of respective rows of TFTs in a progressive scanning way, to turn on the TFTs progressively. In this case, if ultrasonic waves act on the sensing piezoelectric layer 22 to generate a piezoelectric signal, the piezoelectric signal can be received by the respective data lines 102. In FIG. 5, when the finger is pressed against the surface of the touch display substrate, the ultrasonic wave generated by the ultrasonic generator 1 passes through the touch display substrate to reach the contact interface between the finger and the touch display substrate. In this case, the fingerprint ridge contacts the touch display substrate with no gap therebetween, such that the ultrasonic energy emitted to the finger would be absorbed; at the same time, there is a gap between the finger and the touch display substrate at the position of the fingerprint valley, and the ultrasonic energy will be reflected at the interface between the air and the touch display substrate, such that the reflected ultrasonic waves will be detected by the ultrasonic sensors 2. After data processing, a fingerprint pattern can be created based on the above two different signals.

According to an embodiment of the present disclosure, the data electrode 21 and the lower electrode 13 may be disposed substantially in a same layer and electrically insulated from each other, and the bias electrode 23 and the upper electrode 11 may be disposed substantially in a same layer and electrically insulated from each other. Alternatively, the data electrode 21 and the upper electrode 11 may be disposed substantially in a same layer and electrically insulated from each other, and the bias electrode 23 and the lower electrode 13 may be disposed substantially in a same layer and electrically insulated from each other. The sensing piezoelectric layer 22 and the generating piezoelectric layer 12 may be disposed substantially in a same layer.

That is, the data electrode 21 and the lower electrode 13 can be formed by a same mask processing, the sensing piezoelectric layer 22 and the generating piezoelectric layer 12 can be formed by a same mask processing, and the bias electrode 23 and the upper electrode 11 can be formed by a same mask processing. It should be noted that the bias electrode 23 may be connected to the common electrode in the whole-surface form of the display substrate, and the upper electrode 11 needs to be electrically insulated from the common electrode. Therefore, an insulating layer 4 can be formed between the upper electrode 11 of the ultrasonic generator 1 and the common electrode.

Figure 7:
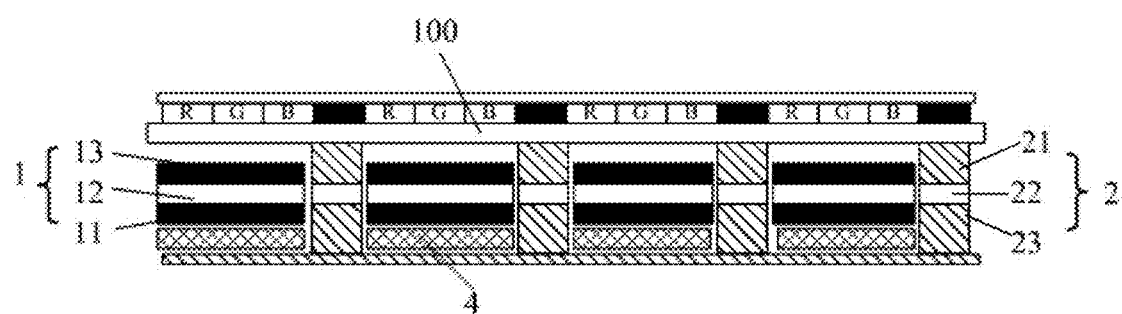
FIGS. 7 to 8 are schematic diagrams illustrating a structure of a touch display substrate according to another embodiment of the disclosure.
Figure 8:
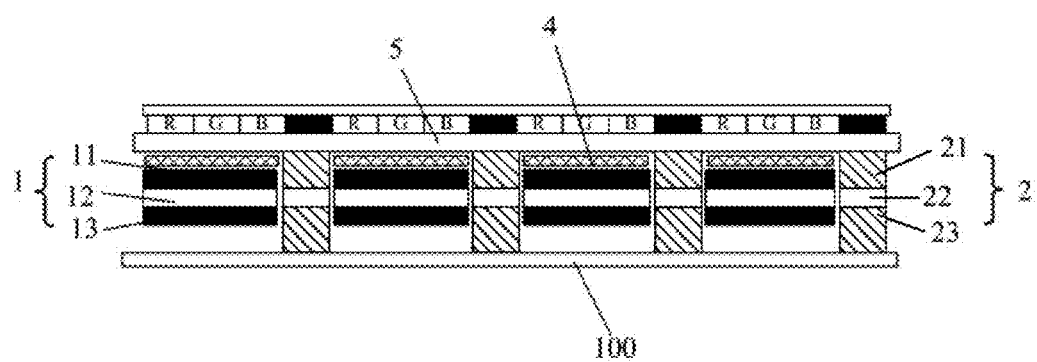

FIGS. 7 to 8 are schematic diagrams illustrating a structure of a touch display substrate according to another embodiment of the disclosure.

As illustrated in FIGS. 7 and 8, a touch display substrate according to an embodiment of the present disclosure may include a substrate 100, a plurality of ultrasonic sensors 2 disposed on the substrate 100, and one ultrasonic generator 1 disposed on the substrate 100. The ultrasonic generator 1 and the ultrasonic sensors 2 are disposed substantially in a same layer. The ultrasonic generator 1 has a plurality of openings, and the plurality of ultrasonic sensors 2 are disposed in the plurality of openings. A pixel 3 includes a plurality of sub-pixels, and a black matrix is provided around the sub-pixels. An orthographic projection area of each ultrasonic sensor 2 on the substrate 100 is less than or equal to an orthographic projection area of a grid line of the black matrix on the substrate 100, and an orthographic projection area of the ultrasonic generator 1 on the substrate 100 is less than or equal to an orthographic projection area of the pixels 3 on the substrate 100.

In this embodiment, the ultrasonic generator 1 and the ultrasonic sensors 2 are disposed substantially in a same layer, but they are not disposed substantially in a same layer as the sub-pixels. Each of the pixels 3 is provided with an ultrasonic sensor 2, and the ultrasonic generator 1 is disposed around the edge of each of the ultrasonic sensors 2.

It should be understood that the size, thickness, and the like of the various structures illustrated in the drawings are merely for illustration. In implementations, the projected areas of the various structures on the substrate 100 may be the same or different, and the desired area of each structure may be implemented by a mask etching process. Moreover, the geometric shape of each of the structures illustrated in the drawings is not limited thereto, instead, for example, a rectangle as illustrated in the drawings may be replaced by a trapezoid or other shapes formed by etching. Similarly, the desired shape may be implemented by a mask etching process.

According to an embodiment of the present disclosure, the sub-pixels and the ultrasonic sensors 2 may be respectively disposed on two opposite surfaces of the substrate 100 as illustrated in FIG. 7. The sub-pixels share a same glass substrate 100 with the ultrasonic sensors 2, that is, sub-pixels may be formed on the upper surface (also referred to as a front surface) of the substrate 100, and the ultrasonic sensors 2 may be formed on the lower surface (also referred to as a back surface) of the substrate 100. According to an embodiment of the present disclosure, the bias electrode 23 may be connected to a common electrode in the whole-surface form of the display substrate, and the common electrode in the whole-surface form may be an opaque metal layer which may reflect red (R), green (G) and blue (B) light. Further, the bias electrode 23 may be formed as an indium tin oxide (ITO) layer in the whole-surface form. In order to electrically insulate the upper electrode 11 from the common electrode, the insulating layer 4 may be formed between the upper electrode 11 of the ultrasonic generator 1 and the common electrode. An insulating layer (not shown) may also be formed between the lower electrode 13 of the ultrasonic generator 1 and the substrate 100.

According to an embodiment of the disclosure, the touch display substrate further includes a glass substrate 5 provided with a TFT, the sub-pixels and the black matrix are disposed on one side of the glass substrate 5, and the ultrasonic generator 1 and the ultrasonic sensors 2 are disposed on the other side of the glass substrate, as illustrated in FIG. 8. In order to electrically insulate the upper electrode 11 from the common electrode (not illustrated) of the TFT, the insulating layer 4 may be formed between the upper electrode 11 of the ultrasonic generator 1 and the glass substrate. An insulating layer (not shown) may also be formed between the lower electrode 13 of the ultrasonic generator 1 and the substrate 100. It should be noted that the "upper" electrode or the "lower" electrode in the present disclosure are merely two oppositely disposed electrodes, and the terms such as "upper" and "lower" do not refer to absolute upper or lower in the direction of gravity.

An embodiment of the present disclosure further provides a touch display device including any of the touch display substrates according to various embodiments of the present disclosure. The display device may be, but not limited to, a liquid crystal display panel, an electronic paper, an OLED panel, a mobile phone, a tablet computer, a television, a display, a notebook computer, a digital photo frame, a navigator, and any other product or component with a display function.

Obviously, there may be various changes to specific implementations of the above embodiments. For example, the specific materials of the electrode layers may be selected as needed, and the details for each electrode layer may be adjusted as needed.

It is to be understood that the above embodiments are merely exemplary embodiments utilized to explain the principles of the disclosure, and the disclosure is not limited thereto. Various modifications and improvements can be made by those skilled in the art without departing from the spirit and scope of the disclosure. These modifications and improvements are also considered to be within the scope of the disclosure.

What is claimed is:

1. A touch display substrate, comprising a substrate, a plurality of ultrasonic sensors disposed on the substrate, and one ultrasonic generator, as a single piece, disposed on the substrate, wherein
the ultrasonic generator has a plurality of openings therein, the plurality of ultrasonic sensors are disposed in the plurality of openings, respectively, the plurality of ultrasonic sensors and the ultrasonic generator are disposed in substantially a same layer, and an edge of each of the plurality of ultrasonic sensors is surrounded by the ultrasonic generator,
wherein each of the ultrasonic sensors comprises a data electrode, a bias electrode, and a sensing piezoelectric layer disposed between the data electrode and the bias electrode, and the ultrasonic generator comprises an upper electrode, a lower electrode, and a generating piezoelectric layer disposed between the upper electrode and the lower electrode;
wherein the data electrode and the lower electrode are disposed substantially in a same layer and are electrically insulated from each other, and the bias electrode and the upper electrode are disposed substantially in a same layer and are electrically insulated from each other; and
wherein the bias electrode is connected to a common electrode of the display substrate, and the upper electrode of the ultrasonic generator and the common electrode are provided with an insulating layer therebetween such that the upper electrode is electrically insulated from the common electrode, and the upper electrode, the generating piezoelectric layer, the lower electrode, the insulating layer, and the common electrode are in sequential layers.

2. The touch display substrate according to claim 1, wherein the touch display substrate comprises a plurality of pixels arranged in an array, each of the plurality of pixels comprises a plurality of sub-pixels, and one of the plurality of pixels and one ultrasonic sensor of the ultrasonic sensors arranged in one opening of the plurality of openings and surrounded by the ultrasonic generator.

3. The touch display substrate according to claim 1, wherein the touch display substrate comprises a plurality of pixels arranged in an array and a peripheral area surrounding the plurality of pixels, and each of the plurality of openings corresponds to each of the plurality of pixels.

4. The touch display substrate according to claim 1, wherein the sensing piezoelectric layer and the generating piezoelectric layer are disposed substantially in a same layer.

5. The touch display substrate according to claim 3, wherein each of the plurality of pixels comprises a plurality of sub-pixels, and a black matrix is disposed around the sub-pixels at the peripheral area, wherein an orthographic projection area of each of the ultrasonic sensors on the substrate is less than or equal to an orthographic projection area of a grid line of the black matrix on the substrate, and an orthographic projection area of the ultrasonic generator on the substrate is less than or equal to an orthographic projection area of the plurality of pixels on the substrate.

6. The touch display substrate according to claim 5, wherein each of the sub-pixels and each of the ultrasonic sensors are respectively disposed on two opposite surfaces of the substrate.

7. The touch display substrate of claim 5, further comprising a glass substrate provided with a thin film transistor, wherein
the sub-pixels and the black matrix are disposed on one side of the glass substrate, and the ultrasonic generator and the ultrasonic sensors are disposed on the other side of the glass substrate.

8. A touch display device, comprising the touch display substrate of claim 1.

9. A touch display substrate, comprising a substrate, a plurality of ultrasonic sensors disposed on the substrate, and one ultrasonic generator, as a single piece, disposed on the substrate, wherein
the ultrasonic generator has a plurality of openings therein, the plurality of ultrasonic sensors are disposed in the plurality of openings, respectively, the plurality of ultrasonic sensors and the ultrasonic generator are disposed in substantially a same later, and an edge of each of the plurality of ultrasonic sensors is surrounded by the ultrasonic generator,
wherein each of the ultrasonic sensors comprises a data electrode, a bias electrode, and a sensing piezoelectric layer disposed between the data electrode and the bias electrode, and the ultrasonic generator comprises an upper electrode, a lower electrode, and a generating piezoelectric layer disposed between the upper electrode and the lower electrode;
wherein the data electrode and the upper electrode are disposed substantially in a same layer and are electrically insulated from each other, and the bias electrode and the lower electrode are disposed substantially in a same layer and are electrically insulated from each other; and
wherein the data electrode is connected to a common electrode of the display substrate, and the upper electrode of the ultrasonic generator and the common electrode are provided with an insulating layer therebetween such that the upper electrode is electrically insulated from the common electrode, and the upper electrode, the generating piezoelectric layer, the lower electrode, the insulating layer and the common electrode are in sequential layers.

10. The touch display substrate according to claim 9, wherein the touch display substrate comprises a plurality of pixels arranged in an array, each of the plurality of pixels comprises a plurality of sub-pixels, one of the plurality of pixels and one ultrasonic sensor of the plurality of ultrasonic sensors are arranged in one opening of the plurality of openings and surrounded by the ultrasonic generator.

11. The touch display substrate according to claim 9, wherein the touch display substrate comprises a plurality of pixels arranged in an array and a peripheral area surrounding the plurality of pixels, and each of the plurality of openings corresponds to each of the plurality of pixels.

12. The touch display substrate according to claim 9, wherein the sensing piezoelectric layer and the generating piezoelectric layer are disposed substantially in a same layer.

13. The touch display substrate according to claim 11, wherein each of the plurality of pixels comprises a plurality of sub-pixels, and a black matrix is disposed around the sub-pixels at the peripheral area, wherein an orthographic projection area of each of the ultrasonic sensors on the substrate is less than or equal to an orthographic projection area of a grid line of the black matrix on the substrate, and an orthographic projection area of the ultrasonic generator on the substrate is less than or equal to an orthographic projection area of the plurality of pixels on the substrate.

14. The touch display substrate according to claim 13, wherein each of the sub-pixels and each of the ultrasonic sensors are respectively disposed on two opposite surfaces of the substrate.

15. The touch display substrate according to claim 13, further comprising a glass substrate provided with a thin film transistor, wherein
the sub-pixels and the black matrix are disposed on one side of the glass substrate, and the ultrasonic generator and the ultrasonic sensors are disposed on the other side of the glass substrate.

16. A touch display device, comprising the touch display substrate according to claim 9.

17. A touch display substrate, comprising a substrate, a plurality of ultrasonic sensors disposed on the substrate, and one ultrasonic generator disposed on the substrate, wherein
the ultrasonic generator has a plurality of openings, and at least one of the plurality of ultrasonic sensors is disposed in at least one of the plurality of openings,
wherein each of the ultrasonic sensors comprises a data electrode, a bias electrode, and a sensing piezoelectric layer disposed between the data electrode and the bias electrode, and the ultrasonic generator comprises an upper electrode, a lower electrode, and a generating piezoelectric layer disposed between the upper electrode and the lower electrode;
wherein the data electrode and the lower electrode are disposed substantially in a same layer and are electrically insulated from each other, and the bias electrode and the upper electrode are disposed substantially in a same layer and are electrically insulated from each other; and
wherein the bias electrode is connected to a common electrode of the display substrate, with the bias electrode and the common electrode being in directly adjacent layers or the bias electrode and the common electrode are formed as a single piece, and the upper electrode of the ultrasonic generator and the common electrode are provided with an insulating layer therebetween such that the upper electrode is electrically insulated from the common electrode, and the upper electrode, the generating piezoelectric layer, the lower electrode, the insulating layer and the common electrode are in sequential layers.

18. The touch display substrate according to claim 17, wherein the touch display substrate comprises a plurality of pixels arranged in an array, each of the plurality of pixels comprises a plurality of sub-pixels, the ultrasonic sensor and the sub-pixels are arranged in an array, and the ultrasonic generator has a grid-shaped distribution.

19. The touch display substrate according to claim 17, wherein the ultrasonic generator and the ultrasonic sensors are disposed substantially in a same layer.

20. The touch display substrate according to claim 17, wherein the touch display substrate comprises a plurality of pixels arranged in an array and a peripheral area surrounding the plurality of pixels, and each of the plurality of openings corresponds to each of the plurality of pixels.

* * * * *